United States Patent [19]
Colvin

[11] Patent Number: 5,892,539
[45] Date of Patent: Apr. 6, 1999

[54] PORTABLE EMISSION MICROSCOPE WORKSTATION FOR FAILURE ANALYSIS

[75] Inventor: James Barry Colvin, Fremont, Calif.

[73] Assignee: Alpha Innotech Corporation, San Leandro, Calif.

[21] Appl. No.: 555,186

[22] Filed: Nov. 8, 1995

[51] Int. Cl.[6] ........................................... H04N 7/18
[52] U.S. Cl. .................................. 348/80; 324/760
[58] Field of Search ............................ 348/49, 80, 86, 348/87, 92; 324/760

[56] References Cited

U.S. PATENT DOCUMENTS

| | | | |
|---|---|---|---|
| 4,164,461 | 8/1979 | Schilling | 204/192 EC |
| 4,357,203 | 11/1982 | Zelez | 156/643 |
| 4,556,317 | 12/1985 | Sandland et al. | 356/237 |
| 4,618,938 | 10/1986 | Sandland et al. | 364/552 |
| 4,680,635 | 7/1987 | Khurana | 358/211 |
| 4,722,298 | 2/1988 | Rubin et al. | 118/715 |
| 4,755,874 | 7/1988 | Esrig et al. | 358/106 |
| 4,772,846 | 9/1988 | Reeds | 324/158 E |
| 4,811,090 | 3/1989 | Khurana | 358/93 |
| 5,035,768 | 7/1991 | Mu et al. | 156/626 |
| 5,059,785 | 10/1991 | Doyle et al. | 250/309 |
| 5,124,639 | 6/1992 | Carlin et al. | 324/760 |
| 5,301,006 | 4/1994 | Bruce | 356/311 |
| 5,475,316 | 12/1995 | Hurley et al. | 324/750 |

OTHER PUBLICATIONS

J. Colvin, "The Identification of Compromised Oxide Interfaces Using Noise Signature Techniques From a Constant Current Source", Proceedings of the 20th International Symposium for Testing and Failure Analysis, 13–18 Nov. 1994.

L. Baker et al., "A Simplified Application Of a Slow Scan CCD 'Astronomy' Camera To Emission Microscopy And Fluorescent Microthermography", The 20th International Symposium for Testing and Failure Analysis, 13–18 Nov. 1994.

The Micromanipulator Co. Inc., Model 8800 Series TEMPSEAL and DRYER SYSTEM, product brochure, (no date).

J. Colvin, "Color Voltage Contrast: A New Method of Implementing Fault Contrast With Color Imaging Software", International Symposium for Testing and Failure Analysis, Nov. 16, 1995.

"Hypervision—The Leader in Emission Microscopy", Hypervision Corporation, (no date).

*Primary Examiner*—Brian Casler
*Assistant Examiner*—Luanne P. Din
*Attorney, Agent, or Firm*—Haverstock & Owens LLP

[57] ABSTRACT

A more efficient portable emission microscope system comprising a cooled CCD camera coupled to microscope optics for detection of photon emissions from integrated circuits. Portability is achieved with a small light tight box and rubber boot combination which are used in conjunction with a probe station or portable stand. The optics are modified to contain an illuminating ring of light emitting diodes for sample illumination prior to or after emission acquisition. Sensitivity is increased by elevating the substrate temperature. In operation, an integrated circuit is enclosed by a rubber boot. An illuminated reference image is then obtained with the LEDs "on," and a background image is obtained with the LEDs "off." The background image represents illumination noise. The temperature of the circuit is then raised while the circuit is biased. Temperature elevation is accomplished by installing small power resistors at the base of an appropriate burn-in socket. This elevation in temperature causes photon emissions from faults in the circuit. An illumination image is then obtained which captures the photon emissions. The background image is then subtracted from the illumination image to filter the image. Finally, the illumination image is superimposed on the reference image to allow a user to determine the exact location of any failures.

29 Claims, 5 Drawing Sheets

PORTABLE EMISSION MICROSCOPE WORKSTATION FOR FAILURE ANALYSIS

FIELD OF THE INVENTION

This invention relates to the field of emission microscopes. More particularly, this invention relates to the field of portable thermal excitation emission microscopy workstations for failure analysis of integrated circuits.

BACKGROUND OF THE INVENTION

In the design of semiconductor devices, analysis of these devices is often desired under certain test conditions. Such analysis is particularly beneficial with respect to integrated circuits (IC) for isolating points of potential failure. It is well known that in IC operation, fault conditions or failures can cause extremely faint photon emissions. These photon emissions can be detected by an emission microscope such as the one described in U.S. Pat. No. 4,680,635 to Khurana.

Khurana describes an invention wherein an IC is placed on a microscope stage with the area to be inspected centered in the axis of the optic system and camera. A light tight chamber is closed around the microscope, the IC is illuminated, and while being viewed through the CRT display by the operator, positioned with the area of interest in the microscope axis. An image is then obtained through the video camera of a reflected light top view of the structural pattern of the IC. The image is digitized and stored in memory. The illumination source is then turned off and without applying any power, background noise light from the inspection area is collected. This background image is then digitized and stored in memory. A failure condition "test vector" of voltages is applied by manual switches to the I/O terminals of the IC causing leakage current conducted through defective dielectric features to emit extremely faint visible and infrared light. This emitted light is collected and amplified to obtain an emitted light image which is digitized and stored.

A user can thereafter subtract the background image from the emitted light image to cancel out any background noise. A further filtering process is performed to separate emitted light points from the random noise bright points. A failure engineer can then take this final image and superimpose it over the original illuminated composite image to locate the exact location of any possible faults.

U.S. Pat. No. 4,755,874 to Esrig et al. also describes an emission microscope similar to Khurana. The benefit here, however, is the addition of a magnification lens providing for a larger viewing area. This allows a user to view the entire IC at one time and identify dynamic failure condition defects.

A drawback with the above two referenced patents is that they both require a darkbox to shield the IC under test from external light. Darkboxes tend to be large and bulky and by their very nature, are not portable. What is therefore needed is an emission microscope workstation that is portable. What is further needed is a system wherein the camera can be interfaced with existing microscope optics associated with production testers for on-site emission acquisition. This improves portability and decreases costs. What is still further needed is a system that provides for true color emission acquisition imaging which allows multiple emission sites on a die to be spatially resolved and categorized with qualitative spectral emission software.

SUMMARY OF THE INVENTION

The present invention provides for a more efficient portable emission microscope system comprising a cooled CCD (charge coupled device) camera coupled to microscope optics for detection of photon emissions from integrated circuits. Portability is achieved with a small light tight box and rubber boot combination which are used in conjunction with a probe station or portable stand. The optics are modified to contain an illumination source comprising fiber optics or a ring of light emitting diodes for sample illumination prior to or after emission acquisition. Sensitivity is increased by elevating the substrate temperature.

In operation, an integrated circuit is enclosed by a rubber boot. An illuminated reference image is then obtained with the illumination source "on," and a background image is obtained with the illumination source "off." The background image represents illumination noise. The temperature of the circuit is then raised while the circuit is biased. Temperature elevation is accomplished by installing small power resistors at the base of an appropriate burn-in socket. This elevation in temperature causes increased photon emissions from faults in the circuit. An illumination image is then obtained which captures the photon emissions. The background image is then subtracted from the illumination image to filter the image. Finally, the illumination image is superimposed on the reference image to allow a user to determine the exact location of any failures.

DETAILED DESCRIPTION OF THE PREFERRED EMBODIMENT

While describing the invention and its embodiments, certain terminology will be utilized for the sake of clarity. It is intended that such terminology not limit the scope of the invention. Therefore, the invention includes all technical equivalents which perform substantially the same function, in substantially the same manner to achieve substantially the same result.

Figure 1:
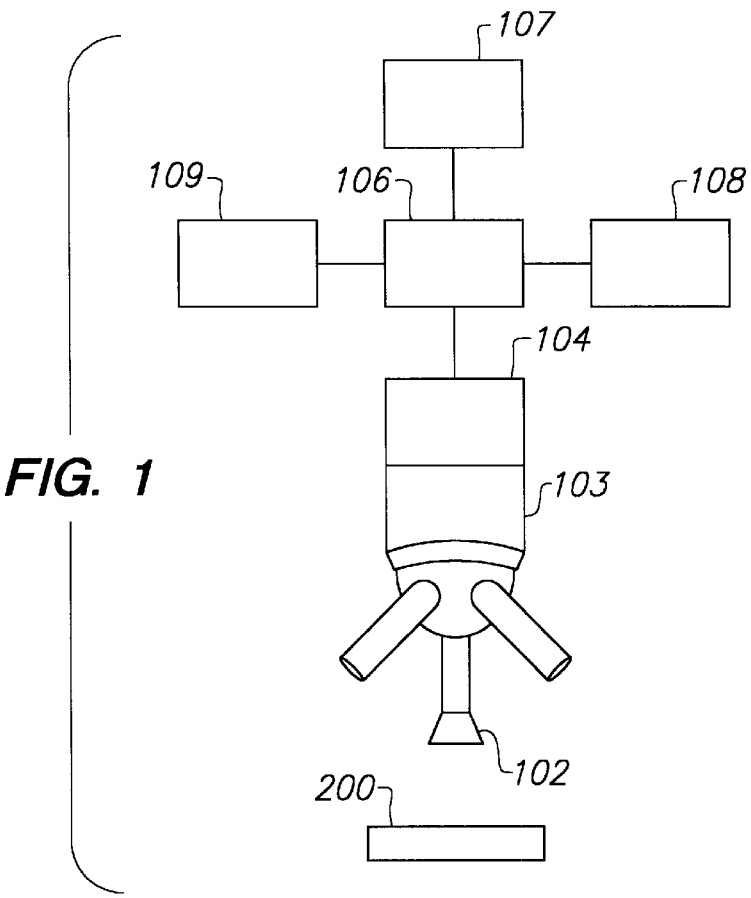
FIG. 1 illustrates the preferred embodiment of the present invention.

FIG. 1 illustrates the preferred embodiment of the present invention. Here, a small light-tight box 200 houses an integrated circuit 203 (see FIG. 2) to be tested. A rubber boot 102 is fitted over an aperture 302 in the box 200 (see FIG.

3) to further shield the circuit 203 from any extraneous light. This rubber boot 102 is ideally constructed of a collapsible soft rubber which facilitates a tight fit and retractability for test insertion and magnification change. Although this is the ideal construction, other types of construction can be implemented.

The rubber boot 102 is coupled to microscope optics 103 which allow for varying magnifications of the circuit 203. A cooled CCD camera 104 is coupled to the microscope optics 103 and allows for high resolution image of the circuit 203. The cooled CCD camera 104 is used because conventional cameras produce heat which tends to introduce noise and interference into the image.

An image processor 106 is coupled to the cooled CCD camera 104 and processes the received images. The image processor 106 is capable of not only digitizing the received image, but it is also capable of performing other processing functions. These functions include, but are not limited to, image enhancement, noise filtering and superimposing images to obtain a composite image. A storage means 108 is coupled to the image processing computer 106 for storing the aforementioned images. This storage means 108 includes not only fixed storage mediums such as a hard drive, but also disk drives and tape drives which allow for potentially unlimited storage capacity. Finally the images may be viewed by a user in one of two formats. It may either be viewed on a display 107 such as a television monitor or it may be printed on a printer 109.

Figure 2:
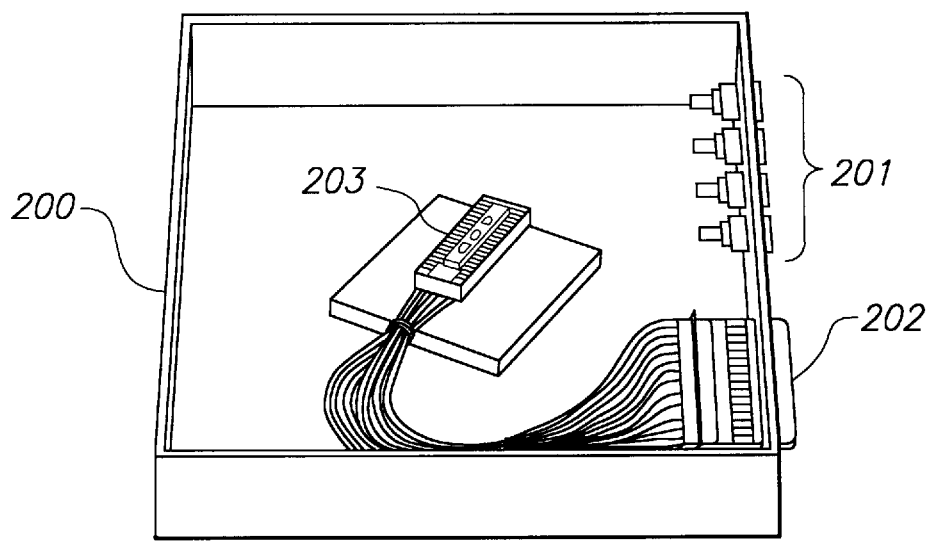
FIG. 2 illustrates the small light-tight box with the cover removed.
Figure 3:
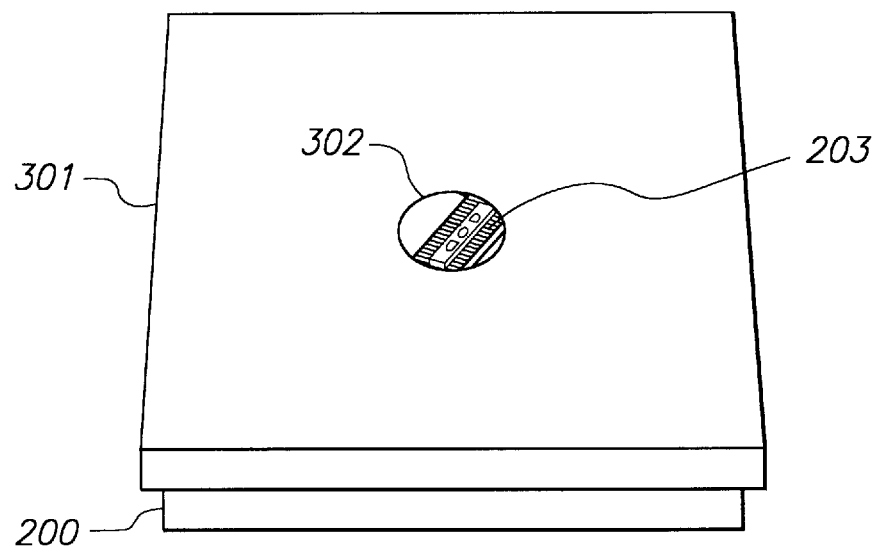
FIG. 3 illustrates the small light-tight box with the cover in place.

FIG. 2 illustrates the small light-tight box 200 with its cover 301 removed. Coupled to the box 200 are banana plugs 201 and pin connector 202 which provide access to the circuit 203. FIG. 3 illustrates the small light-tight box with the cover 301 in place. An aperture 302 is located in the cover for allowing the microscope optics 103 to view the circuit 203.

Figure 4:
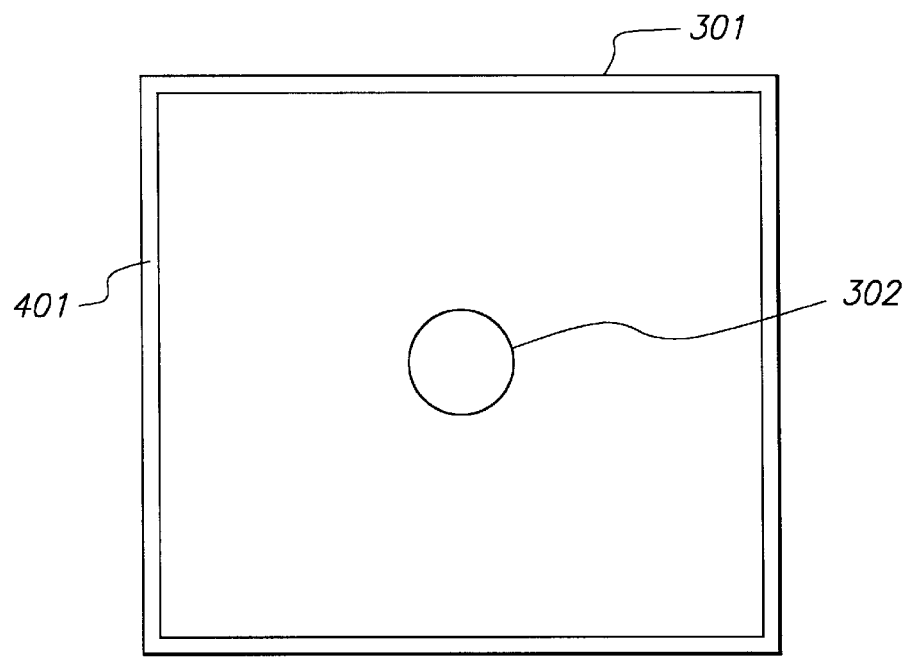
FIG. 4 illustrates the underside of the cover for the light-tight box.

FIG. 4 illustrates the underside of the cover 301. A groove 401 is located at the outer underside edge of the cover 301 and provides for a light-tight fit with the light-tight box 200. While the groove 401 is used in the preferred embodiment to create a light-tight seal between the cover 301 and the box 200, it should be apparent that other types of seals may be incorporated to create an equally effective seal.

Figure 5:
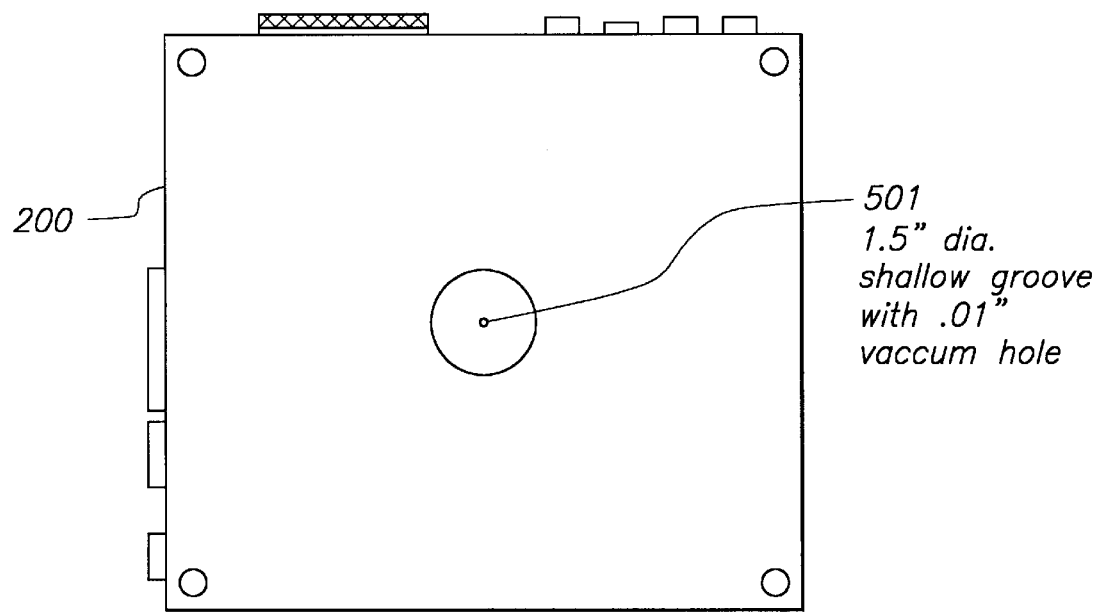
FIG. 5 illustrates the under side of the light-tight enclosure.

FIG. 5 illustrates the underside of the box 200. A small aperture 501 is located through the underside of the box 200 and is used to create a vacuum which can hold the integrated circuit 203 in place.

Figure 6:
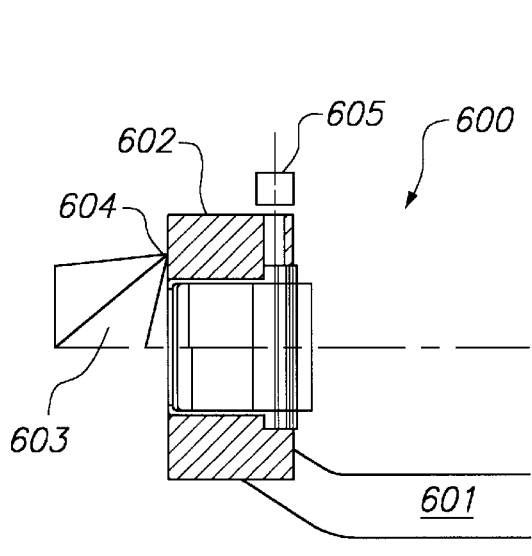
FIG. 6 illustrates a side cross sectional view of an illumination source utilizing fiber optics.

FIG. 6 illustrates a side cross sectional view of an illumination source 600 utilizing fiber optics. Light enters the illumination source 600 through a fiber optic cable 601 and fills a fiber optic ring 602 with light. Light 603 exits the fiber optic ring 602 through an aperture 604 in a coating over the ring. The light 603 illuminates the integrated circuit 203 to obtain a reference image of the circuit 203. A thumbscrew 605 is used to secure the illumination source 600 to the camera. The illumination source 600 is preferably housed within the rubber boot 102, but could be located within the box 200.

Figure 7:
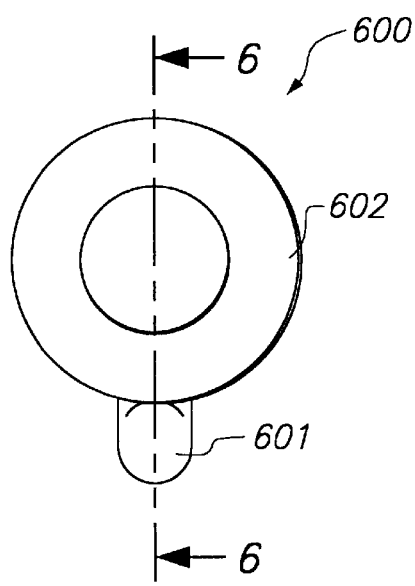
FIG. 7 illustrates a top cross sectional view of the illumination source utilizing fiber optics.

FIG. 7 illustrates a top cross sectional view of the illumination source 600 utilizing fiber optics. The fiber optic cable 601 is also shown in FIG. 7.

Figure 8:
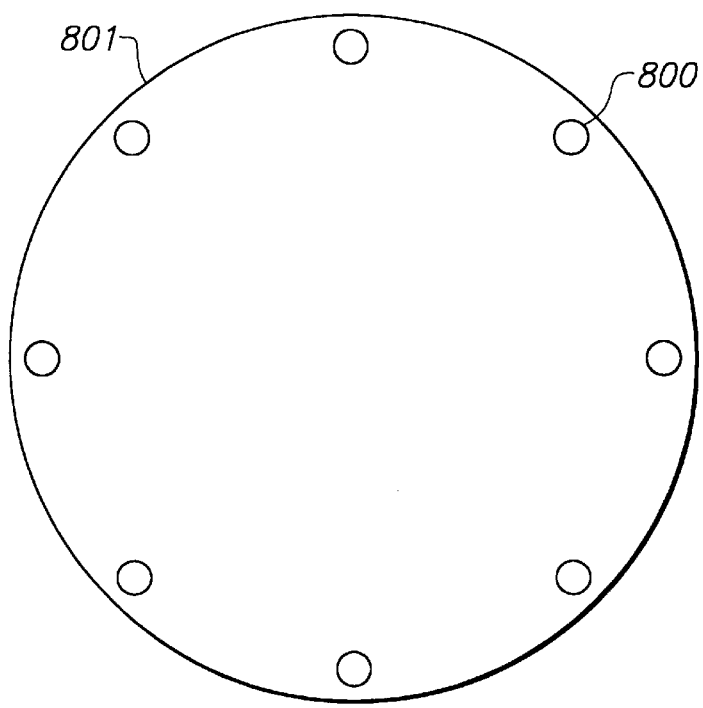
FIG. 8 illustrates the ring of LED lights for illuminating the integrated circuit device under test.

FIG. 8 illustrates a ring of LEDs 800 coupled to the inside of a macro lens 801. The LEDs may be used instead of the illumination source using fiber optics; it will be apparent that any known illumination source could be used. In operation, the LEDs are used to illuminate the integrated circuit 203 to obtain a reference image of the circuit 203. This illuminated image is later used as a reference map to allow the user to locate the precise location of a fault condition. Although the ring of LEDs 800 is shown here as coupled to the inside of the macro lens 801, it may just as well be coupled to any lens or even to the inside of the rubber boot 102 illustrated in FIG. 1.

Figure 9:
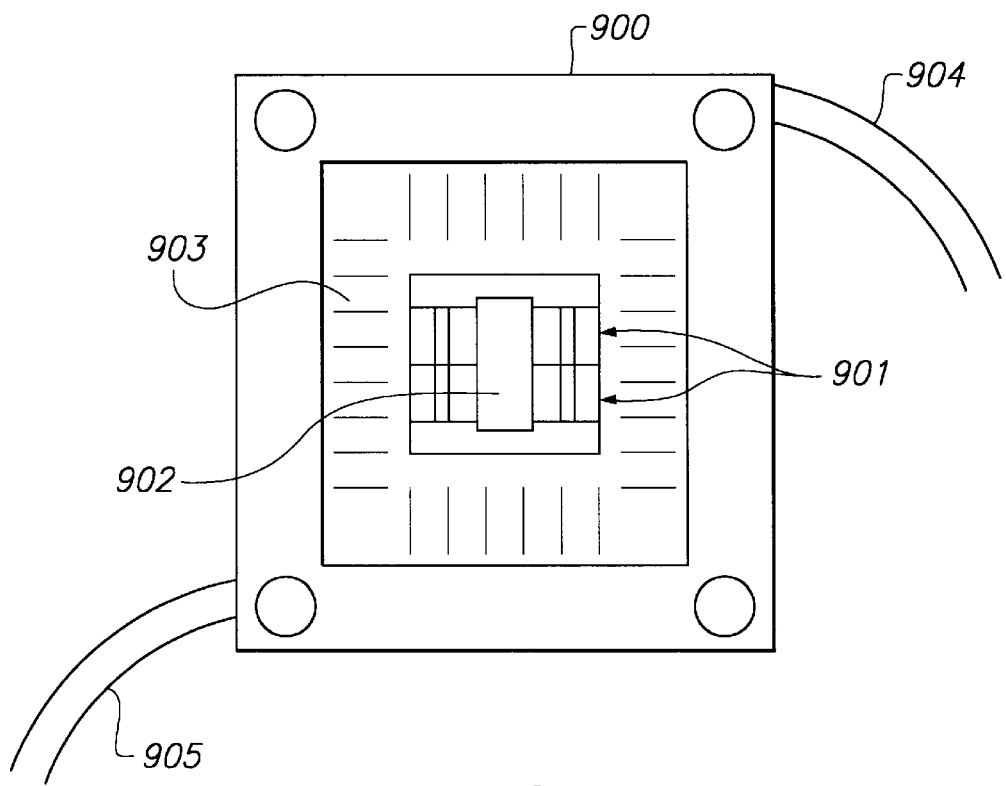
FIG. 9 illustrates the power resistors used for elevating the temperature of the integrated circuit while the device is under test.
Figure 10:
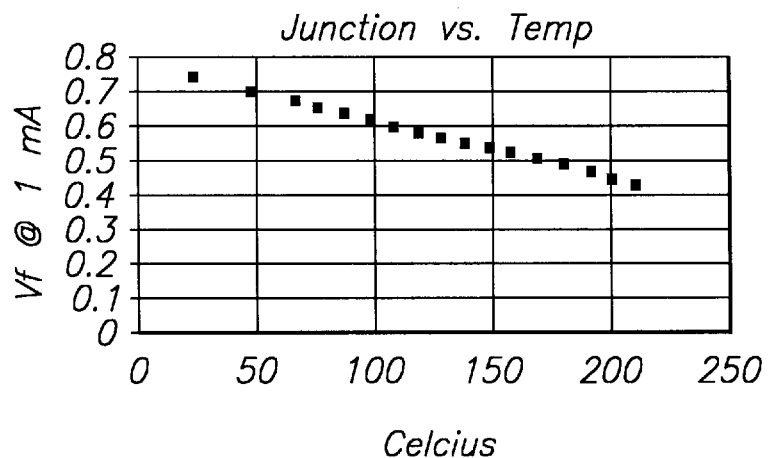
FIG. 10 illustrates a graph characterizing the change in built-in voltage versus temperature for a forward biased pin on the integrated circuit.
Figure 11:
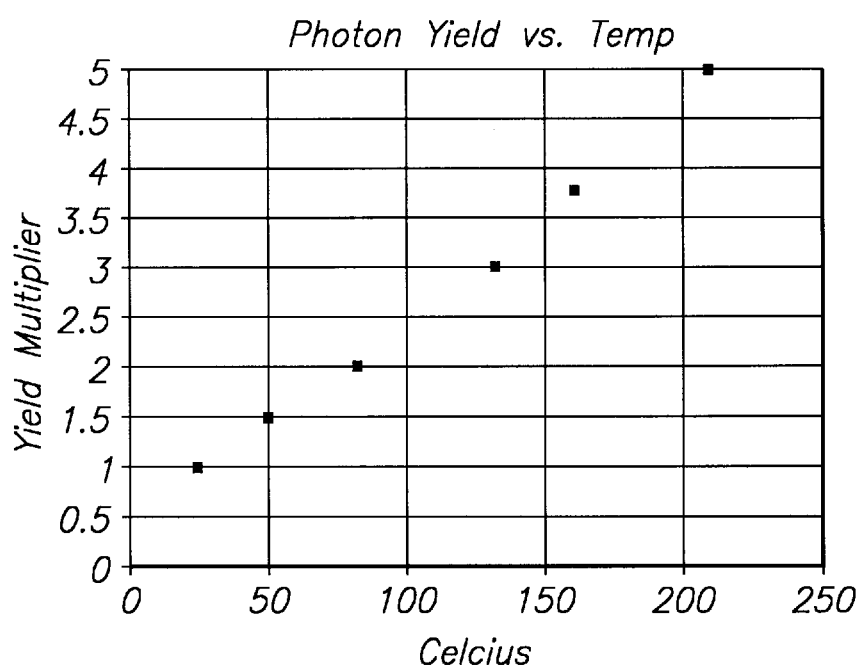
FIG. 11 illustrates a graph representing the dependency between photon yield and temperature increases.

FIG. 9 illustrates a detailed view of a burn-in socket 900 to which the circuit 203 is coupled for thermal excitation emission microscopy. Pins 903 contact the integrated circuit 203 and provide a signal for biasing the circuit 203. Power resistors 901 are coupled to the burn-in socket 900 and to the power lines 904 and 905. With the aid of a band 902, heat from the power resistors 901 elevates the temperature of the circuit 203. Temperature calibration is accomplished by characterizing the change in built-in voltage versus voltage. A typical calibration curve of forward voltage drop versus temperature is illustrated in FIG. 10. FIG. 11 illustrates a graph representing the dependency between photon yield and temperature increases by a factor of 2 for each 50° C. increase for a forward biased diode. This shows that increasing the temperature of the circuit 203 increases the number of energetic carriers, resulting in increased annihilation and hence, increased photon yield. More importantly, this shows that the photon yield can be increased up to 5 times increasing the sensitivity of the system.

The technique is especially useful for the analysis of ESD (electro-static discharge) damaged junctions with low leakage values since elevating the temperature increases the number of intrinsic carriers and decreases the resistance, resulting in elevated leakage levels for a fixed voltage. More importantly, the photon yield can be increased up to 5 times, allowing detection of the damage origin.

In operation, a user couples an integrated circuit 203 to the burn-in socket 900 within the box 200. The cover 301 is placed on the box 200 and the rubber boot 102 is lowered to enclose the aperture 302. A background image is then obtained which represents illumination noise. The illumination source is then turned on and illuminate the circuit 203. The camera 104 then obtains a reference image of the circuit. This reference image will be used later in assisting the user to located the precise location of a fault. The illumination source is then turned off and the power resistors 901 are powered while the circuit 203 is biased. The band 902 either contacts the circuit 203 or is in close proximity to the circuit 203 and helps dissipate the heat from the power resistors 901 to increase the temperature of the circuit 203.

The camera 104 then obtains a light emitted image which includes any light emitted from faults in the circuit 203. The processor 106 then subtracts the background image from the light emitted image to form a difference image. This difference image is then superimposed onto the reference image thus enabling a user to locate the precise location of any failures. The processor 106 may additionally provide animation features wherein a succession of images may be viewed in sequence. This to allow a user to view dynamic failures.

In one embodiment, the invention may be used in conjunction with a wafer sort testing apparatus on a test floor. In this embodiment, the invention may be positioned to view an integrated circuit under test in the wafer sorter through an aperture in the wafer sorter. Therefore, the wafer sorter replaces the light-tight box 200 and the rubber boot 102 is positioned over the aperture in the wafer sorter to shield light. The invention may then be used to analyze failures detected by the wafer sorter. For example, if a wafer sorter identifies a particular failure signature that commonly recurs or is associated with a new batch of integrated circuits, the invention may be conveniently used to more fully analyze the failure without substantially interrupting or impeding the production flow.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention.

What is claimed is:

1. An apparatus for shielding an integrated circuit from ambient light when the integrated circuit is being viewed by an emission microscope, the apparatus comprising:
   a. a housing for enclosing the integrated circuit, wherein the housing includes an aperture such that a substantial portion of the microscope is external to the housing; and
   b. a flexible boot removably attached to an objective of the microscope and configured to surround the aperture such that an optical path between the objective and the aperture is shielded from ambient light wherein the housing and the flexible boot cooperate to form a light tight zone around the integrated circuit.

2. The apparatus according to claim 1 further comprising an illumination source coupled to the objective and mounted withing the light tight zone for illuminating the integrated circuit device to create a reference image.

3. The apparatus according to claim 1 further comprising a camera coupled to the microscope for converting an optical image to an electronic image signal.

4. The apparatus according to claim 1 further comprising a processing means coupled to the camera for filtering unwanted noise from the electronic image signal and for superimposing a reference image.

5. The apparatus according to claim 1 further comprising a display means coupled to the processing means for displaying a display image.

6. An apparatus for detecting defects in an integrated circuit, the apparatus comprising:
   a. a housing for containing the integrated circuit, wherein the housing includes an aperture;
   b. a microscope for creating a magnified optical image of the integrated circuit wherein the microscope comprises an objective for viewing the integrated circuit through the aperture;
   c. a flexible boot removably attached to the objective for shielding an optical path between the aperture and the objective from ambient light;
   d. a CCD camera for capturing the magnified optical image of the integrated circuit;
   e. an image processor coupled to the CCD camera for receiving and processing the magnified optical image; and
   f. a display coupled to the image processor for receiving and displaying a processed image of the integrated circuit.

7. The apparatus according to claim 6 wherein a substantial portion of the microscope is uncovered by the boot and exposed to ambient light.

8. The apparatus according to claim 6 wherein a wafer sorter comprises the housing.

9. The apparatus according to claim 6 further comprising connecting means for making an electrical connection between the integrated circuit and a circuit external to the housing for stimulating the integrated circuit.

10. The apparatus according to claim 6 further comprising a light source for illuminating the integrated circuit with visible light.

11. The apparatus according to claim 6 further comprising a light source for illuminating the integrated circuit with infra-red light.

12. The apparatus according to claim 6 further comprising means for controlling a temperature of the integrated circuit.

13. An apparatus for detecting defects in an integrated circuit, comprising:
   a. a housing for containing the integrated circuit, wherein the housing includes an aperture;
   b. an objective of a microscope for creating a magnified optical image of the integrated circuit;
   c. a flexible boot coupled to the objective for shielding the aperture and the objective from ambient light, wherein a substantial portion of the microscope is uncovered by the boot and exposed to ambient light;
   d. a CCD camera coupled to the microscope for capturing the magnified optical image of the integrated circuit;
   e. an image processor coupled to the CCD camera for receiving and processing the magnified optical image; and
   f. a display coupled to the image processor for receiving and displaying a processed image of the integrated circuit.

14. The apparatus according to claim 13 wherein a wafer sorter comprises the housing.

15. The apparatus according to claim 13 further comprising connecting means for making an electrical connection between the integrated circuit and a circuit external to the housing for stimulating the integrated circuit.

16. The apparatus according to claim 13 further comprising a light source for illuminating the integrated circuit with visible light.

17. The apparatus according to claim 13 further comprising a light source for illuminating the integrated circuit with infra-red light.

18. The apparatus according to claim 13 further comprising means for controlling a temperature of the integrated circuit.

19. A method of detecting photons emitted from defects in an integrated circuit comprising steps of:
   a. shielding the integrated circuit from ambient light with a light-tight enclosure, wherein the enclosure includes an aperture for allowing the photons to exit the enclosure;
   b. aligning an objective of a microscope with the aperture for receiving the photons;
   c. shielding an optical path between the objective and the aperture from ambient light with a boot that is removably attached to the objective;
   d. biasing the integrated circuit; and
   e. forming an emission image of the integrated circuit according to an intensity of the photons emitted from the integrated circuit.

20. The method according to claim 19 wherein a substantial portion of the microscope is external to the boot and exposed to ambient light.

21. The method according to claim 19 wherein a wafer sorter comprises the lighttight enclosure.

22. The method according to claim 19 further comprising a step of increasing a temperature of the integrated circuit for performing thermal excitation emission microscopy.

23. The method according to claim 19 further comprising steps of:
   a. illuminating the integrated circuit with a light source within the boot; and
   b. obtaining a reference image of the integrated circuit.

24. The method according to claim 23 further comprising a step of superimposing the emission image onto the reference image.

25. A method of detecting photons emitted from defects in an integrated circuit comprising steps of:
   a. shielding the integrated circuit from ambient light with a light-tight enclosure, wherein the enclosure includes a aperture for allowing the photons to exit the enclosure;
   b. aligning an objective of a microscope with the aperture for receiving the photons;
   c. shielding an optical path between the objective and the aperture from external illumination with a boot, wherein a substantial portion of the microscope is uncovered by the boot and exposed to ambient light;
   d. biasing the integrated circuit; and
   e. forming an emission image according to an intensity of the photons emitted from the integrated circuit.

26. The method according to claim 25, wherein a wafer sorter comprises the light-tight enclosure.

27. The method according to claim 26 further comprising a step of increasing a temperature of the integrated circuit for performing thermal excitation emission microscopy.

28. The method according to claim 25 further comprising steps of:
   a. illuminating the integrated circuit with a light source within the boot; and
   b. obtaining a reference image of the integrated circuit.

29. The method according to claim 28 further comprising a step of superimposing the image onto the reference image.

* * * * *